United States Patent
De Haan (10) Patent No.: US 10,051,384 B2
(45) Date of Patent: Aug. 14, 2018

(54) DISTORTION FREE FILTER BANK FOR A HEARING DEVICE

(71) Applicant: Oticon A/S, Smørum (DK)

(72) Inventor: Jan Mark De Haan, Smørum (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 15/482,049

(22) Filed: Apr. 7, 2017

(65) Prior Publication Data

US 2017/0295438 A1    Oct. 12, 2017

(30) Foreign Application Priority Data

Apr. 10, 2016 (EP) ..................................... 16164591

(51) Int. Cl.
| H04R 25/00 | (2006.01) |
| H04R 3/00 | (2006.01) |
| H04R 1/10 | (2006.01) |

(52) U.S. Cl.
CPC .............. H04R 25/505 (2013.01); H04R 3/00 (2013.01); H04R 1/1008 (2013.01);
(Continued)

(58) Field of Classification Search
CPC ...... H04R 1/1008; H04R 1/1016; H04R 3/00; H04R 25/00; H04R 25/504; H04R 25/554; H04R 2225/43
See application file for complete search history.

(56) References Cited

U.S. PATENT DOCUMENTS

| 5,436,940 A * | 7/1995 | Nguyen ................. H04B 1/667 704/231 |
| 8,532,319 B2 * | 9/2013 | Bauml ................. H04R 25/453 381/320 |

(Continued)

OTHER PUBLICATIONS

Karp et al., "Modified DFT Filter Banks with Perfect Reconstruction", IEEE Transactions on Circuits and Systems—II: Analog and Digital Signal Processing, vol. 46, No. 11, Nov. 1999, pp. 1404-1414.

(Continued)

Primary Examiner — Brian Ensey
(74) Attorney, Agent, or Firm — Birch, Stewart, Kolasch & Birch, LLP (57) ABSTRACT

The application relates to a filter bank for an audio processing device, e.g. a hearing aid. The filter bank comprises
an analysis filter bank comprising a plurality of M first filters $h_m(n)$, where $m=0, 1, \ldots, M-1$ is a frequency band index, and whose impulse responses are modulated from a first linear phase prototype filter $h(n)$ with a first predetermined modulation sequence ms1, n being a time index, the first prototype filter $h(n)$ having a first filter length of $L_h$;
a synthesis filter bank comprising a plurality of M second filters $g_m(n)$, $m=0, 1, \ldots, M-1$, whose impulse responses are modulated from a second linear phase prototype filter $g(n)$ with a second predetermined modulation sequence ms2, the second prototype filter $g(n)$ having a second filter length of $L_g$;
the plurality of first and second filters being arranged in pairs, each pair forming a frequency channel.
the first modulation sequence is a complex or real function of time n, frequency band index m, and a first prototype filter delay $\tau_h$,
the second modulation sequence is a complex or real function of time n, frequency band index m, and a second prototype filter delay $\tau_g$, (Continued)

the first filter length $L_h$ and the second filter length $L_g$ are both uneven, and the first prototype filter delay $\tau_h$ is equal to $(L_h-1)/2$ and second prototype filter delay $\tau_g$, is equal to $(L_g-1)/2$, and the first and second prototype filter delay $\tau_h$ and $\tau_g$, are constants of the analysis filter bank and the synthesis filter bank, respectively.

15 Claims, 5 Drawing Sheets

(52) U.S. Cl.
CPC ............ *H04R 1/1016* (2013.01); *H04R 25/00* (2013.01); *H04R 25/554* (2013.01); *H04R 2225/43* (2013.01)

(56) References Cited

U.S. PATENT DOCUMENTS

| | | |
|---|---|---|
| 9,779,748 B2 * | 10/2017 | Ekstrand ................. G10L 19/26 |
| 2009/0290736 A1 | 11/2009 | Alfsmann et al. |
| 2015/0333734 A1 | 11/2015 | Ekstrand |

OTHER PUBLICATIONS

Shaeen, "Prototype Filter Design Approaches for Near Perfect Reconstruction Cosine Modulated Filter Banks—A Review", XP-002760648: J. Sign Process Syst., vol. 81, 2015, 183-195.

* cited by examiner

DISTORTION FREE FILTER BANK FOR A HEARING DEVICE

SUMMARY

Filter banks are used in hearing devices, such as hearing aids, in order to provide the possibility of signal processing in frequency bands, such as spatial filtering, noise reduction and dynamic range compression. Different processing types may pose different requirements on the frequency channels in which the processing is performed.

Important parameters of filter banks in digital hearing aid processing are frequency resolution (both band overlap/separation and band interspacing), group delay, distortion and computational complexity. The filter bank should also provide the possibility of signal analysis in channels, which are constructed on the filter bank sub-bands.

A filter bank that have the following key properties is proposed in the present disclosure:
  Truly linear phase, constant group delay, free of phase distortion. Both in analysis stage and analysis-synthesis combined (overall response).
  Selectable delay (balancing with band overlap/separation), independent of band interspacing.
  Free of amplitude distortion and minimal aliasing distortion.
  Low complexity using existing poly-phase DFT-modulated filter bank structure.

A Filter Bank:

In an aspect of the present application, a filter bank for an audio processing device, e.g. a hearing aid is provided. The filter bank comprises
  an analysis filter bank comprising a plurality of M first filters $h_m(n)$, where m=0, 1, ..., M−1 is a frequency band index, and whose impulse responses are modulated from a first linear phase prototype filter h(n) with a first predetermined modulation sequence ms1, n being a time index, the first prototype filter h(n) having a first filter length of $L_h$;
  a synthesis filter bank comprising a plurality of M second filters $g_m(n)$, m=0, 1, ..., M−1, whose impulse responses are modulated from a second linear phase prototype filter g(n) with a second predetermined modulation sequence ms2, the second prototype filter g(n) having a second filter length of $L_g$;
  the plurality of first and second filters being arranged in pairs, each pair forming a frequency channel, and
  the first modulation sequence is a complex or real function of time n, frequency band index m, and a first prototype filter delay $\tau_h$,
  the second modulation sequence is a complex or real function of time n, frequency band index m, and a second prototype filter delay $\tau_g$,
  the first filter length $L_h$ and the second filter length $L_g$ are both uneven, and the first prototype filter delay $\tau_h$ is equal to $(L_h-1)/2$ and second prototype filter delay $\tau_g$, is equal to $(L_g-1)/2$, and the first and second prototype filter delay $\tau_h$ and $\tau_g$, are constants of the analysis filter bank and the synthesis filter bank, respectively.

Thereby an improved filter bank is provided.

In an embodiment, the first filter length $L_h$ is equal to the second filter length of $L_g$, e.g. in the range between 25 and 250, e.g. equal to 125. In an embodiment, the number M of first filters $h_m$ and second filters $g_m$ is larger than the first filter length $L_h$ of the first prototype filter and/or than the second length $L_g$ of the second prototype filter. In an embodiment, the number M of first filters $h_m$ and second filters $g_m$ is smaller than the first filter length $L_h$ of the first prototype filter and/or than the second length $L_g$ of the second prototype filter. In an embodiment, M is in the range from 32 to 512, e.g. equal to 128.

In an embodiment, the first modulation sequence ms1 is adapted to shift the first prototype filter h(n) in frequency with a normalized frequency f=m/M, and the second modulation sequence ms2 is adapted to shift the second prototype filter g(n) in frequency with a normalized frequency f=m/M.

In an embodiment, the first modulation sequence ms1 is adapted to be time shifted by the first prototype filter delay $\tau_h$, and the second modulation sequence ms2 is adapted to be time shifted by the first prototype filter delay $\tau_g$. This ensures that, when all bands are summed together, the resulting transfer function is a pure delay, i.e. linear phase and free amplitude distortion.

In an embodiment, the center frequency of the first and second prototype filters h(n) and g(n) are both zero.

In an embodiment, the first modulation sequence ms1 is equal to $e^{j2\pi(n-\tau_h)m/M}$ and the second modulation sequence ms2 is equal to $e^{j2\pi(n-\tau_g)m/M}$. In an embodiment, the first and second modulation sequences are real. In an embodiment, the first and second modulation sequences are cosine modulated sequences.

In an embodiment, the first prototype filters h(n) are subject to the constraint that the sum of all first filters $h_m(n)$ of the analysis filter bank is equal to $\delta(n-\tau_h)$. The sum of all first filters $h_m(n)$ of the analysis filter bank can be expressed as $$\sum_{m=0}^{M-1} h_m(n) = h(n)\sum_{m}^{M-1} e^{j2\pi(n-\tau_h)m/M}.$$

In an embodiment, the following constraints on the first prototype filter h(n) are imposed:

$$h(\tau_h)=1/M$$

$$h(\tau_h+kM)=0, k\in Z, k\neq 0$$

In an embodiment, the overall filter bank response t(n), excluding aliasing terms, is subject to the constraint that $t(n)=\delta(n-\tau)$, where $\tau=\tau_h+\tau_g$. The overall filter bank response $\tau(n)$ is given by:

$$t(n) = \frac{1}{D}\sum_{m=0}^{M-1} h_m(n)*g_m(n).$$

where D is a down-sampling rate (or an up-sampling rate). In general, D≤M/2. In an embodiment, M≥64, e.g. M=128.

In an embodiment, the following constraints on the second prototype filter g(n) are imposed:

$$\frac{1}{D}\sum_{m=0}^{M-1} h_m(n)*g_m(n) = \begin{cases} 1, & n=\tau \\ 0, & n+\tau+kM, k\in Z, k\neq 0 \end{cases}.$$

In an embodiment, the first filters $h_m(n)=h(n)e^{j2\pi(n-\tau_h)m/M}$ are assumed to be known (chosen first), whereby the above constraint is a linear constraint. Alternatively, it may be assumed that the second filters $g_m(n)=g(n)e^{j2\pi(n-\tau_g)m/M}$ are known (chosen first).

An Audio Processing Device:

In an aspect, an audio processing device comprising a filter bank as described above, in the detailed description of embodiments, in the drawings and in the claims is furthermore provided.

In an embodiment, the audio processing device comprises a hearing aid, a headset, an earphone, an ear protection device or a combination thereof.

In the following the audio processing device is exemplified by a hearing aid, but the features may be used more generally in an audio processing device.

In an embodiment, the hearing aid comprises a signal processing unit for enhancing the input signals and providing a processed output signal. In an embodiment, the signal processing unit is adapted to provide a frequency dependent gain and/or a level dependent compression and/or a transposition (with or without frequency compression) of one or frequency ranges to one or more other frequency ranges, e.g. to compensate for a hearing impairment of a user.

In an embodiment, the hearing aid comprises an output unit for providing a stimulus perceived by the user as an acoustic signal based on a processed electric signal. In an embodiment, the output unit comprises a number of electrodes of a cochlear implant or a vibrator of a bone conducting hearing device. In an embodiment, the output unit comprises an output transducer. In an embodiment, the output transducer comprises a receiver (loudspeaker) for providing the stimulus as an acoustic signal to the user. In an embodiment, the output transducer comprises a vibrator for providing the stimulus as mechanical vibration of a skull bone to the user (e.g. in a bone-attached or bone-anchored hearing device).

In an embodiment, the hearing aid comprises an input unit for providing an electric input signal representing sound. In an embodiment, the input unit comprises an input transducer, e.g. a microphone, for converting an input sound to an electric input signal. In an embodiment, the input unit comprises a wireless receiver for receiving a wireless signal comprising sound and for providing an electric input signal representing said sound. In an embodiment, the hearing aid comprises a directional microphone system adapted to spatially filter sounds from the environment, and thereby enhance a target acoustic source among a multitude of acoustic sources in the local environment of the user wearing the hearing aid. In an embodiment, the directional system is adapted to detect (such as adaptively detect) from which direction a particular part of the microphone signal originates. This can be achieved in various different ways as e.g. described in the prior art.

In an embodiment, the hearing aid is portable device, e.g. a device comprising a local energy source, e.g. a battery, e.g. a rechargeable battery.

In an embodiment, the hearing aid comprises a forward or signal path between an input transducer (microphone system and/or direct electric input (e.g. a wireless receiver)) and an output transducer. In an embodiment, the signal processing unit is located in the forward path. In an embodiment, the signal processing unit is adapted to provide a frequency dependent gain according to a user's particular needs. In an embodiment, the hearing aid comprises an analysis path comprising functional components for analyzing the input signal (e.g. determining a level, a modulation, a type of signal, an acoustic feedback estimate, etc.). In an embodiment, some or all signal processing of the analysis path and/or the signal path is conducted in the frequency domain.

In an embodiment, some or all signal processing of the analysis path and/or the signal path is conducted in the time domain.

In an embodiment, an analogue electric signal representing an acoustic signal is converted to a digital audio signal in an analogue-to-digital (AD) conversion process, where the analogue signal is sampled with a predefined sampling frequency or rate $f_s$, $f_s$ being e.g. in the range from 8 kHz to 48 kHz (adapted to the particular needs of the application) to provide digital samples $x_n$ (or x[n]) at discrete points in time $t_n$ (or n), each audio sample representing the value of the acoustic signal at $t_n$ by a predefined number $N_s$ of bits, $N_s$ being e.g. in the range from 1 to 16 bits. A digital sample x has a length in time of $1/f_s$, e.g. 50 µs, for $f_s$=20 kHz. In an embodiment, a number of audio samples are arranged in a time frame. In an embodiment, a time frame comprises 64 or 128 audio data samples. Other frame lengths may be used depending on the practical application.

In an embodiment, the hearing aids comprise an analogue-to-digital (AD) converter to digitize an analogue input with a predefined sampling rate, e.g. 20 kHz. In an embodiment, the hearing aids comprise a digital-to-analogue (DA) converter to convert a digital signal to an analogue output signal, e.g. for being presented to a user via an output transducer.

In an embodiment, the hearing aid comprise(s) a TF-conversion unit for providing a time-frequency representation of an input signal. In an embodiment, the time-frequency representation comprises an array or map of corresponding complex or real values of the signal in question in a particular time and frequency range. In an embodiment, the TF conversion unit comprises a filter bank for filtering a (time varying) input signal and providing a number of (time varying) output signals each comprising a distinct frequency range of the input signal. In an embodiment, the TF conversion unit comprises a Fourier transformation unit for converting a time variant input signal to a (time variant) signal in the frequency domain. In an embodiment, the frequency range considered by the hearing aid from a minimum frequency $f_{min}$ to a maximum frequency $f_{max}$ comprises a part of the typical human audible frequency range from 20 Hz to 20 kHz, e.g. a part of the range from 20 Hz to 12 kHz. In an embodiment, a signal of the forward and/or analysis path of the hearing aid is split into a number NI of frequency bands, where NI is e.g. larger than 5, such as larger than 10, such as larger than 50, such as larger than 100, such as larger than 500, at least some of which are processed individually. In an embodiment, the hearing aid is/are adapted to process a signal of the forward and/or analysis path in a number NP of different frequency channels (NP≤NI). The frequency channels may be uniform or non-uniform in width (e.g. increasing in width with frequency), overlapping or non-overlapping.

In an embodiment, the hearing aid comprises a number of detectors configured to provide status signals relating to a current physical environment of the hearing aid (e.g. the current acoustic environment), and/or to a current state of the user wearing the hearing aid, and/or to a current state or mode of operation of the hearing aid. Alternatively or additionally, one or more detectors may form part of an external device in communication (e.g. wirelessly) with the hearing aid. An external device may e.g. comprise another hearing assistance device, a remote control, and audio delivery device, a telephone (e.g. a Smartphone), an external sensor, etc. In an embodiment, one or more of the number of detectors operate(s) on the full band signal (time domain). In an embodiment, one or more of the number of detectors operate(s) on band split signals ((time-) frequency domain).

In an embodiment, the hearing aid further comprises other relevant functionality for the application in question, e.g. compression, noise reduction, feedback suppression, etc.

Use:

In an aspect, use of a hearing device as described above, in the 'detailed description of embodiments' and in the claims, is moreover provided. In an embodiment, use is provided in a system comprising audio distribution. In an embodiment, use is provided in a system comprising one or more hearing instruments, headsets, ear phones, active ear protection systems, etc., e.g. in handsfree telephone systems, teleconferencing systems, public address systems, karaoke systems, classroom amplification systems, etc.

A Method:

In an aspect, a method of implementing a filter bank for an audio processing device is furthermore provided. The method comprises providing an analysis filter bank comprising a plurality of M first filters $h_m(n)$, where m=0, 1, ..., M−1 is a frequency band index, and whose impulse responses are modulated from a first linear phase prototype filter h(n) with a first predetermined modulation sequence ms1, n being a time index, the first prototype filter h(n) having a first filter length of $L_h$;

providing a synthesis filter bank comprising a plurality of M second filters $g_m(n)$, m=0, 1, ..., M−1, whose impulse responses are modulated from a second linear phase prototype filter g(n) with a second predetermined modulation sequence ms2, the second prototype filter g(n) having a second filter length of $L_g$;

arranging the plurality of first and second filters in pairs, each pair forming a frequency channel;

arranging that the first modulation sequence is a complex or real function of time n, frequency band index m, and a first prototype filter delay $\tau_h$, arranging that the second modulation sequence is a complex or real function of time n, frequency band index m, and a second prototype filter delay $\tau_g$, arranging that the first filter length $L_h$, and the second filter length $L_g$ are both uneven, and arranging that the first prototype filter delay $\tau_h$ is equal to $(L_h-1)/2$ and that the second prototype filter delay $\tau_g$, is equal to $(L_g-1)/2$, and that the first and second prototype filter delay $\tau_h$ and $\tau_g$, are constants of the analysis filter bank and the synthesis filter bank, respectively.

It is intended that some or all of the structural features of the device described above, in the 'detailed description of embodiments' or in the claims can be combined with embodiments of the method, when appropriately substituted by a corresponding process and vice versa. Embodiments of the method have the same advantages as the corresponding devices.

In an embodiment, the method comprises providing that the first modulation sequence ms1 is adapted to be time shifted by the first prototype filter delay $\tau_h$, and the second modulation sequence ms2 is adapted to be time shifted by the first prototype filter delay $\tau_g$.

A Computer Readable Medium:

In an aspect, a tangible computer-readable medium storing a computer program comprising program code means for causing a data processing system to perform at least some (such as a majority or all) of the steps of the method described above, in the 'detailed description of embodiments' and in the claims, when said computer program is executed on the data processing system is furthermore provided by the present application.

By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. In addition to being stored on a tangible medium, the computer program can also be transmitted via a transmission medium such as a wired or wireless link or a network, e.g. the Internet, and loaded into a data processing system for being executed at a location different from that of the tangible medium.

A Data Processing System:

In an aspect, a data processing system comprising a processor and program code means for causing the processor to perform at least some (such as a majority or all) of the steps of the method described above, in the 'detailed description of embodiments' and in the claims is furthermore provided by the present application.

A Hearing System:

In a further aspect, a hearing system comprising an audio processing device as described above, in the 'detailed description of embodiments' and in the claims, AND an auxiliary device is moreover provided.

In an embodiment, the system is adapted to establish a communication link between the hearing device and the auxiliary device to provide that information (e.g. control and status signals, possibly audio signals) can be exchanged or forwarded from one to the other.

In an embodiment, the auxiliary device is or comprises an audio gateway device adapted for receiving a multitude of audio signals (e.g. from an entertainment device, e.g. a TV or a music player, a telephone apparatus, e.g. a mobile telephone or a computer, e.g. a PC) and adapted for selecting and/or combining an appropriate one of the received audio signals (or combination of signals) for transmission to the hearing device. In an embodiment, the auxiliary device is or comprises a remote control for controlling functionality and operation of the hearing device(s). In an embodiment, the function of a remote control is implemented in a SmartPhone, the SmartPhone possibly running an APP allowing to control the functionality of the audio processing device via the SmartPhone (the hearing device(s) comprising an appropriate wireless interface to the SmartPhone, e.g. based on Bluetooth or some other standardized or proprietary scheme).

In an embodiment, the auxiliary device is another hearing aid. In an embodiment, the hearing system comprises two hearing aids adapted to implement a binaural hearing system, e.g. a binaural hearing aid system.

DEFINITIONS

In the present context, a 'hearing aid' refers to a device, such as e.g. a hearing instrument or an active ear-protection device or other audio processing device, which is adapted to improve, augment and/or protect the hearing capability of a user by receiving acoustic signals from the user's surroundings, generating corresponding audio signals, possibly modifying the audio signals and providing the possibly modified audio signals as audible signals to at least one of the user's ears. A 'hearing aid' further refers to a device such as an earphone or a headset adapted to receive audio signals electronically, possibly modifying the audio signals and providing the possibly modified audio signals as audible signals to at least one of the user's ears. Such audible signals may e.g. be provided in the form of acoustic signals radiated into the user's outer ears, acoustic signals transferred as mechanical vibrations to the user's inner ears through the bone structure of the user's head and/or through parts of the middle ear as well as electric signals transferred directly or indirectly to the cochlear nerve of the user.

The hearing aid may be configured to be worn in any known way, e.g. as a unit arranged behind the ear with a tube leading radiated acoustic signals into the ear canal or with a loudspeaker arranged close to or in the ear canal, as a unit entirely or partly arranged in the pinna and/or in the ear canal, as a unit attached to a fixture implanted into the skull bone, as an entirely or partly implanted unit, etc. The hearing aid may comprise a single unit or several units communicating electronically with each other.

More generally, a hearing aid comprises an input transducer for receiving an acoustic signal from a user's surroundings and providing a corresponding input audio signal and/or a receiver for electronically (i.e. wired or wirelessly) receiving an input audio signal, a (typically configurable) signal processing circuit for processing the input audio signal and an output means for providing an audible signal to the user in dependence on the processed audio signal. In some hearing aids, an amplifier may constitute the signal processing circuit. The signal processing circuit typically comprises one or more (integrated or separate) memory elements for executing programs and/or for storing parameters used (or potentially used) in the processing and/or for storing information relevant for the function of the hearing aid and/or for storing information (e.g. processed information, e.g. provided by the signal processing circuit), e.g. for use in connection with an interface to a user and/or an interface to a programming device. In some hearing aids, the output means may comprise an output transducer, such as e.g. a loudspeaker for providing an air-borne acoustic signal or a vibrator for providing a structure-borne or liquid-borne acoustic signal. In some hearing aids, the output means may comprise one or more output electrodes for providing electric signals.

In some hearing aids, the vibrator may be adapted to provide a structure-borne acoustic signal transcutaneously or percutaneously to the skull bone. In some hearing aids, the vibrator may be implanted in the middle ear and/or in the inner ear. In some hearing aids, the vibrator may be adapted to provide a structure-borne acoustic signal to a middle-ear bone and/or to the cochlea. In some hearing aids, the vibrator may be adapted to provide a liquid-borne acoustic signal to the cochlear liquid, e.g. through the oval window. In some hearing aids, the output electrodes may be implanted in the cochlea or on the inside of the skull bone and may be adapted to provide the electric signals to the hair cells of the cochlea, to one or more hearing nerves, to the auditory cortex and/or to other parts of the cerebral cortex.

A 'hearing system' may refer to a system comprising one or two hearing aids or one or two hearing aids and an auxiliary device, and a 'binaural hearing system' refers to a system comprising two hearing aids and being adapted to cooperatively provide audible signals to both of the user's ears. Hearing systems or binaural hearing systems may further comprise one or more 'auxiliary devices', which communicate with the hearing aid(s) and affect and/or benefit from the function of the hearing aid(s). Auxiliary devices may be e.g. remote controls, audio gateway devices, mobile phones (e.g. SmartPhones), public-address systems, car audio systems or music players. Hearing aids, hearing systems or binaural hearing systems may e.g. be used for compensating for a hearing-impaired person's loss of hearing capability, augmenting or protecting a normal-hearing person's hearing capability and/or conveying electronic audio signals to a person.

Embodiments of the disclosure may e.g. be useful in applications such as hearing instruments, headsets, ear phones, active ear protection systems, or combinations thereof.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

The figures are schematic and simplified for clarity, and they just show details which are essential to the understanding of the disclosure, while other details are left out. Throughout, the same reference signs are used for identical or corresponding parts.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

The detailed description set forth below in connection with the appended drawings is intended as a description of various configurations. The detailed description includes specific details for the purpose of providing a thorough understanding of various concepts. However, it will be apparent to those skilled in the art that these concepts may be practised without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The present application relates to the field of hearing devices, e.g. hearing aids.

The present disclosure relates filter banks assumed, in particular to variants of DFT-modulated filter banks, which allow for efficient implementation (low computational and memory cost), which are important parameters of a miniaturized hearing device, e.g. a hearing aid.

U.S. Pat. No. 8,532,319B2 describes a filter bank configuration for a hearing device having filters in an analysis filter bank and corresponding filters in a synthesis filter bank that are coupled pair-wise to form a channel in each case. In order to compensate for a hearing loss, sub-band signals are amplified in the individual channels with the aid of multipliers. In the process, an audible distortion of an output signal Y of the filter bank configuration as a result of differences between amplification factors of the multipliers of neighboring channels should be prevented. Here, at least one channel changes a phase of a sub-band signal transmitted by the channel such that a difference between a group delay of the filter bank configuration and a prescribable reference value is reduced for at least one predetermined frequency. The filter bank configuration is particularly suited to hearing aids.

U.S. Pat. No. 8,532,319B2 describes two solutions to minimize phase distortion:
Phase compensation filters F are used in the sub bands to compensate for the phase distortion which is introduced by the filter bank. In other words, these filter banks are not designed to be free of phase distortion in the first place.
The phase distortion in the analysis filter bank is compensated for by time reversing the prototype filter of the synthesis filter bank. In other words, the analysis filter bank is not free of phase distortion but the overall response is.

In contrast, the solution of the present disclosure is advantageous, since both analysis filter banks and the overall filter bank are free of phase distortion so there is no need for additional processing to minimize phase distortion.

Aspects of the present disclosure relate to time-shifting of the modulation sequence. Other aspects relate to constraints on the prototype filter.

Figure 1A:
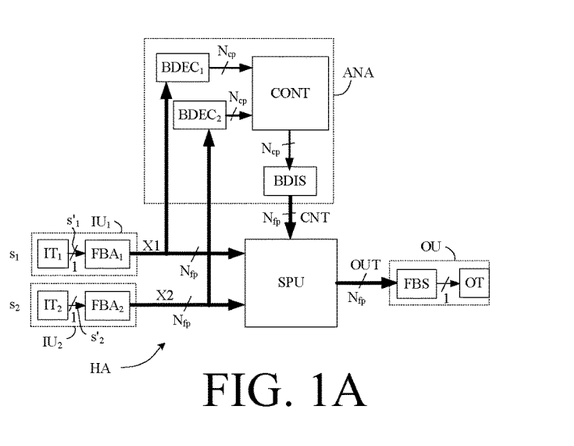
FIG. 1A shows a first embodiment of a hearing aid comprising a filter bank according to the present disclosure.
Figure 1B:
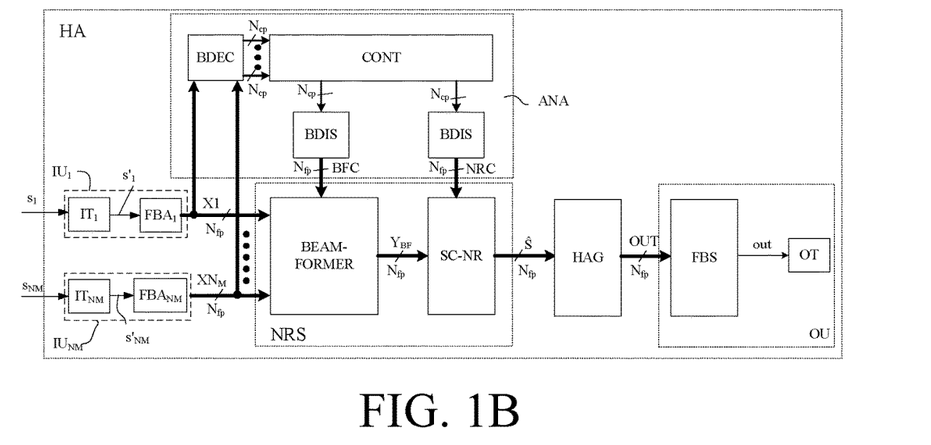
FIG. 1B shows a second embodiment of a hearing aid comprising a filter bank according to the present disclosure.

FIG. 1A shows an embodiment of a hearing aid (HA) comprising a filter bank according to the present disclosure. The hearing aid (HA) is e.g. adapted for being located at or in left and right ears of a user, or adapted for being fully or partially implanted in the head of the user. The hearing aid is e.g. adapted to compensate for a hearing impairment of a particular user. The hearing aid comprises a forward path comprising first and second input units $IU_1$, $IU_2$ for providing first and second electric input signals IN1, IN2 representing audio signals in a number $N_{fp}$ of frequency bands, a signal processing unit (SPU) for processing the first and second electric input signals IN1, IN2, and providing a processed signal OUT based thereon, and an output unit (OU) for converting the processed signal to output stimuli perceivable as sound by a user. The first and second input units ($IU_1$, $IU_2$) each comprises respective first and second input transducers ($IT_1$, $IT_2$) and first and second analysis filter banks ($FBA_1$, $FBA_2$). The first and second input transducers ($IT_1$, $IT_2$), e.g. first and second microphones, are e.g. adapted to pick up sound ($s'_1$, $s'_2$) from the environment of the hearing aid and to convert it to respective first and second electric signals representative of the sound. The first and second electric signals ($s'_1$, $s'_2$) are provided as digital audio samples (e.g. by respective analogue-to-digital converters forming part of the first and second input transducers). The first and second analysis filter banks ($FBA_1$, $FBA_1$) are analysis filter banks according to the present disclosure, configured to provide the respective digitized electric signals as frequency band signals IN1, IN2, in $N_{fp}$ frequency bands. The signal processing unit is e.g. configured to process the electric input signals IN1, IN2 in a number of frequency bands, e.g. in $N_{fp}$ (or less) frequency bands, and to provide the processed signal OUT in $N_{fp}$ (or less) frequency bands. The output unit (OU) comprises a synthesis filter bank (FBS) according to the present disclosure configured to convert the processed frequency band signal OUT into an electric (time domain, full band) output signal. The output unit further comprises an output transducer, e.g. a loudspeaker or a vibrator for stimulating bone conduction, or a number of electrodes for electrically stimulating a hearing nerve, for providing output stimuli perceivable by the user as sound. The hearing aid (HA) further comprises an analysis and control unit ANA adapted for analyzing the input signals and/or signals from one or more detectors and to provide one or more control signals CNT for influencing or controlling processing (e.g. the combination of the first and second input signals IN1, IN2) of the signal processing unit (SPU). The analysis and control unit (ANA) comprises first and second band decimation units ($BDEC_1$, $BDEC_2$) for decimating the number of frequency bands $N_{fp}$ of the first and second electric input signals IN1, IN2 to $N_{cp}$ ($N_{cp}<N_{fp}$) in order to conserve power (which is a critical parameter of a portable, relatively small, electronic device, such as a hearing aid). Due to the properties of the analysis filter banks ($FBA_1$, $FBA_2$) of the present disclosure, the frequency bands can be combined (e.g. summed or averaged or otherwise processed) to provide a smaller number of frequency bands without phase distortion. The analysis and control unit (ANA) further comprises a control unit (CONT) for providing $N_{cp}$ band decimated control signal(s) based on $N_{cp}$ band decimated versions of input signals IN1 and IN2. The analysis and control unit (ANA) further comprises band distribution unit (BDIS) configured to distribute $N_{cp}$ band signals to $N_{fp}$ band signals, ($N_{cp}<N_{fp}$) here control signal CNT, which is fed to the signal processing unit (SPU) for influencing its processing, e.g. of input signals X1, X2. The hearing aid may e.g. contain more than two input units (e.g.

comprising microphones and/or wireless electric audio inputs), as e.g. indicated in FIG. 1B FIG. 1B shows an embodiment of a hearing aid (HA) in FIG. 1A, but comprising M input units, and where the signal processing unit is further detailed out. The forward path comprises input units ($IU_1$, $IU_{NM}$), noise reduction system (NRS), processor (HAG) for providing a level and frequency dependent gain, and an output unit (OU). The signal processing unit (SPU) of FIG. 1A is represented in FIG. 1B by noise reduction system (NRS) and processor (HAG).

The hearing aid (HA) of FIG. 1B comprises a multitude of input units $IU_i$, $i=1, \ldots, N_M$, $N_M$ being larger than or equal to two for converting respective sound signals $s_i$ or receiving respective audio signals $s_i$. and providing corresponding time variant electric input signals Xi, $i=1, \ldots, N_M$. Each of the respective input units ($IU_1, \ldots, IU_M$) provide a time-frequency representation $Xi_m$ ($m=1, 2, \ldots, M=N_{fp}$) of the time variant electric input signal Xi, each representing the electric input signal Xi at an $i^{th}$ input unit in a number $M=N_{fp}$ of frequency bands and a number of time instances, m being a frequency band index.

The multi-input unit noise reduction systems (NRS) comprises a multi-channel beamformer filtering unit (BEAMFORMER, e.g. an MVDR beamformer) providing beamformed signal $Y_{BF}(m)$ (as a weighted combination of multi-frequency band electric input signals $X1(m), \ldots, XN_M(m)$, $m=1, 2, \ldots, M$). The noise reduction systems (NRS) additionally comprises a single-channel post-processing filter unit (SC-NR) providing enhanced (beamformed and noise reduced) signal $\hat{S}(m)$. The single-channel post-processing filter unit (SC-NR) is operationally coupled to the multi-channel beamformer filtering unit (BEAMFORMER) and configured to provide an enhanced signal $\hat{S}(m)$ in a number of frequency bands $M=N_{fp}$ based on the beamformed signal $Y_{BF}(m)$. A purpose of the single-channel post-processing filter unit (SC-NR) is to suppress noise components from the target direction, which have not been suppressed by the spatial filtering provided by the multi-channel beamformer filtering unit (BEAMFORMER). The analysis and control unit (ANA) provides control signals BFC(m) and NRC(m), $m=1, 2, \ldots, M$, which are provided to the BEMFORMER- and SC-NR-units, respectively, to influence or control functionality of these units. As mentioned in connection with FIG. 1A, the analysis and control unit is fully or partially operated in a smaller number $N_{cp}$ of frequency bands than the forward path (e.g. to minimize power consumption) making use of the truly linear properties of the filter bank according to the present disclosure, which allows decimation and distribution (units BDEC and BDIS, respectively) to be performed without distortion of amplitude or phase of the frequency band signals in question.

The hearing aid (HA) may e.g. further comprise a user interface configured to communicate with another device, e.g. a remote control or a contra-lateral hearing aid of a binaural hearing aid system, thereby allowing a user to influence functionality of the hearing aid(s).

Figure 2:
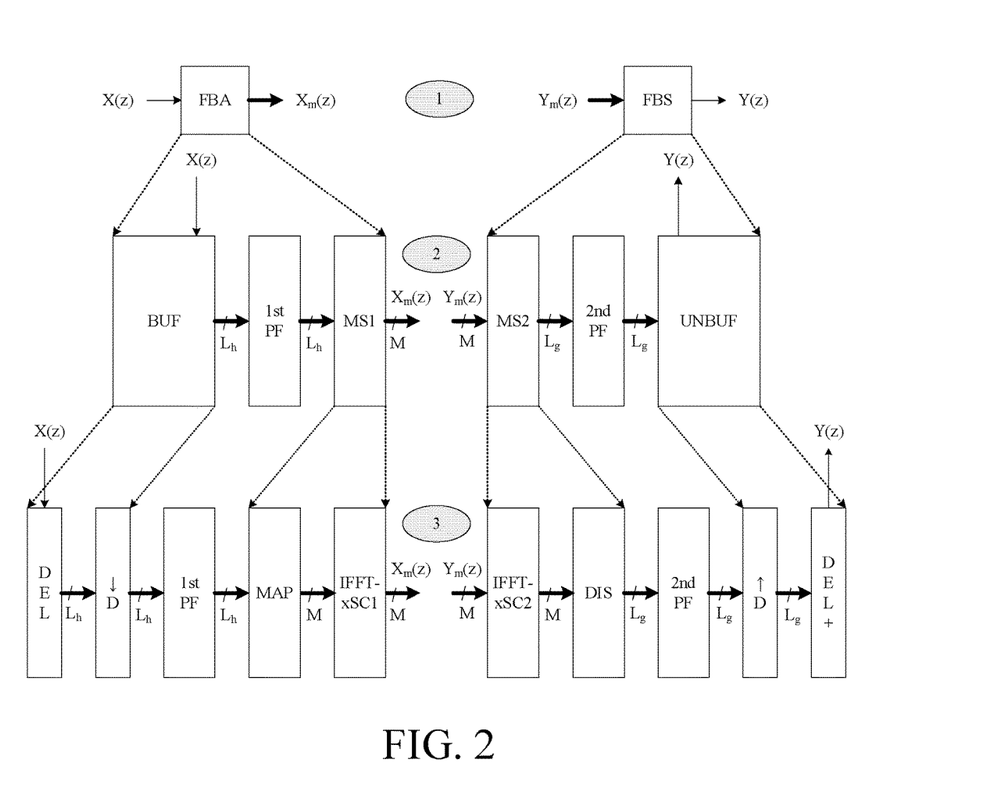
FIG. 2 shows an embodiment of a filter bank for an audio processing device according to the present disclosure in different levels of detail.

FIG. 2 shows an embodiment of a filter bank for an audio processing device, e.g. a hearing aid, according to the present disclosure. The filter bank in FIG. 2 is illustrated at three different levels (denoted 1, 2, and 3, as indicated by grey shaded ellipses with corresponding numbers 1, 2, 3 in the middle of FIG. 2). Signals of the filter bank are quoted in the z-transform domain. The filter bank may alternatively be described in the time domain, in the time-frequency domain (or any other appropriate domain).

As illustrated at the first level (level 1) of FIG. 2, the filter bank comprises an analysis filter bank (FBA) for converting a time variant input signal X(z) representing an audio signal into a number of time variant frequency band signals $X_m(z)$, $m=0, 1, \ldots, M-1$, each representing a sub-band of the total frequency range of the input signal. The filter bank further comprises a synthesis filter bank (FBS) for converting a number of time variant frequency band signals $Y_m(z)$, $m=0, 1, \ldots, M-1$, to a time variant output signal Y(z) representing the audio signal or a processed version thereof.

The analysis and synthesis filter banks may be used independently of each other, but may advantages be arranged together to provide a number of frequency channels of a forward path for propagating (and processing) an audio signal in an audio processing device, such as a hearing aid. The time variant input signal X(z) may e.g. correspond to (one of) the electric input signals $s'_i$ ($i=1, 2, \ldots,$ or $N_M$) of a hearing aid as described in FIG. 1A or 1B. The time variant output signal Y(z) may e.g. correspond to time variant (full band) output signal out in FIG. 1B (input signal to the output transducer (OT) in FIG. 1A as well as FIG. 1B).

At the second level (level 2) of FIG. 2, the analysis filter bank (FBA) and the synthesis filter bank (FBS) are split into a number of functional units. The analysis filter bank (FBA) comprises a plurality of M first filters $H_m(z)$ (or $h_m(n)$ in the time domain, n), where $m=0, 1, \ldots, M-1$ is a frequency band index, and whose impulse responses are modulated from a first linear phase prototype filter h(n) (cf. unit 1stPF in FIG. 2) with a first predetermined modulation sequence ms1 (cf. unit MS1 in FIG. 2), where n is a time index. The first prototype filter h(n) has a first filter length of $L_1$, as indicated on the sub-band signals from the first prototype filter unit (1stPF) to the first modulation sequence unit (MS1). The first modulation sequence unit (MS1) provides M first frequency band signals $X_m(z)$, $m=0, 1, \ldots, M-1$ from the $L_h$ prototype filtered band signals from the $1^{st}$ prototype filter (1stPF). Correspondingly, the synthesis filter bank (FBS) comprises a plurality of M second filters $G_m(z)$ (or $g_m(n)$ in the time domain), $m=0, 1, \ldots, M-1$, whose impulse responses are modulated from a second linear phase prototype filter g(n) (cf. unit 2ndPF in FIG. 2) with a second predetermined modulation sequence ms2 (cf. unit MS2 in FIG. 2). The second prototype filter g(n) has a second filter length of $L_g$, as indicated on the sub-band signals from the second modulation sequence unit (MS2) to the second prototype filter unit (2ndPF). The second modulation sequence unit (MS2) provides $L_g$ modulation sequence band signals to the $2^{nd}$ prototype filter (2ndPF) based on M second frequency band signals $Y_m(z)$, $m=0, 1, \ldots, M-1$. $Y_m(z)$ may e.g. represent processed versions of $X_m(z)$. $Y_m(z)$ may e.g. correspond to signal OUT in the hearing aid of FIGS. 1A and 1B. The plurality of first and second filters $H_m(z)$ and $G_m(z)$, respectively, are arranged in pairs ($X_m$, $Y_m$), each pair forming a frequency channel.

The first and second modulation sequences are complex or real functions of time (index) n, frequency band index m, and the first and second prototype filter delays $\tau_h$, and $\tau_g$, respectively. The first and second prototype filter delays, $\tau_h$ and $\tau_g$, are constants of the analysis filter bank (FBA) and the synthesis filter bank (FBS), respectively. The first filter length $L_h$, and the second filter length $L_g$ are both uneven. The first prototype filter delay $\tau_h$ is equal to $(L_4-1)/2$. The second prototype filter delay $\tau_g$ is equal to $(L_g-1)/2$. The first prototype filter h(n) is typically different from the second prototype filter g(n), each having a center frequency of 0.

In the embodiment of a filter bank illustrated at the second level (level 2) of FIG. 2, the analysis filter bank (FBA) and the synthesis filter bank (FBS) further comprises respective buffer (BUF) and unbuffer (UNBUF) units. The buffer unit (BUF) of the analysis filter bank (FBA) provides a buffer of length $L_h$ of the time variant input signal X(z). The output of the buffer unit (BUF) comprises $L_h$ (possibly down-sampled) consecutive time samples of the input signal X(z), which are fed to respective $L_h$ inputs of the $1^{st}$ prototype filter unit (1stPF). The unbuffer unit (UNBUF) of the synthesis filter bank (FBS) provides the output signal Y(z) from the $L_g$ outputs of the $2_{nd}$ prototype filter unit (2ndPF).

In the embodiment of a filter bank illustrated at the third level (level 3) of FIG. 2, the functional units of the analysis filter bank (FBA) and the synthesis filter bank (FBS) are split into a further number of functional units. In the analysis filter bank (FBA), the buffer unit (BUF) is implemented by a delay line (DEL) in combination with a down-sampling unit (↓D). The Delay line (DEL) provides $L_h-1$ individual delays $\tau_h$ to the input signal thereby (at a given time) providing $L_h$ different samples of the input signal X(z). The $L_h$ values of the input signals are fed to the down-sampling unit (↓D), where they are down-sampled with a common down-sampling rate D (where D≤M). The choice of D is e.g. a compromise between power consumption (small D) and aliasing problems (large D). The $L_h$ down-sampled values of the input signal are fed to the first prototype filter unit (1 stPF). In the synthesis filter bank (FBS), the unbuffer unit (UNBUF) is implemented by an up-sampling unit (↓D) in combination with a delay-and-sum line (DEL+). The $L_g$ prototype filtered sub-band signals from the second prototype filter (2ndPF) are each up-sampled with a common up-sampling rate D in the up-sampling unit (↓D). Typically (e.g. in the forward path of a hearing aid) the up-sampling rate is the same as the down-sampling rate (equal to D), but this need not be the case. The respective $L_g$ up-sampled values are fed to the delay-and-sum line (DEL+), where each is delayed with a unique number of delays $\tau_g$ (n·$\tau_g$, where n=0, 1, ..., $L_g-1$). In some applications, $\tau_g=\tau_h$. This need not be the case, however. A resulting, time variant output signal Y(z) is thereby provided as an output of the delay-and-sum line (DEL+).

In the embodiment of a filter bank illustrated at the third level (level 3) of FIG. 2, the first modulation sequence unit (MS1) of the analysis filter bank (FBA) is implemented by mapping unit (MAP) and inverse Fourier transform unit (IFFT-xSC1). The mapping unit (MAP) is configured to map the $L_h$ inputs from the first prototype filter unit ($1^{st}$PF) to M outputs which are fed to the inverse Fourier transform unit (IFFT-xSC1). The mapping scheme is further described below in connection with FIGS. 3A, 3B, 3C and FIG. 4. The inverse Fourier transform unit (IFFT-xSC1) performs an inverse (M×M matrix) Fast Fourier Transform on the M inputs from the mapping unit (MAP) and provides M sub-band signals $X_m(z)$. The inverse Fourier transform unit (IFFT-xSC1) performs the inverse Fourier transform without scaling (as indicated by the xSC in the name of the unit). Correspondingly, the second modulation sequence unit (MS2) of the synthesis filter bank (FBS) is implemented by inverse Fourier transform unit (IFFT-xSC2) and distribution unit (DIS). The inverse Fourier transform unit (IFFT-xSC2) performs an inverse (M×M matrix) Fast Fourier Transform (again without scaling) on the M sub-band signals $Y_m(z)$ and provides M transformed signals to the distribution unit (DIS). The distribution unit (DIS) distributes the M input signals to $L_g$ signals according to a predefined scheme (inverse of the mapping scheme of the analysis filter bank). The $L_g$ signals from the distribution unit (DIS) are fed to the second prototype filter unit (2ndPF).

An embodiment of the contents of the various functional blocks of FIG. 2 are further described in connection with FIGS. 3A, 3B and 3C below.

Distortion Free DFT-Modulated Analysis Filter Bank

Figure 3A:
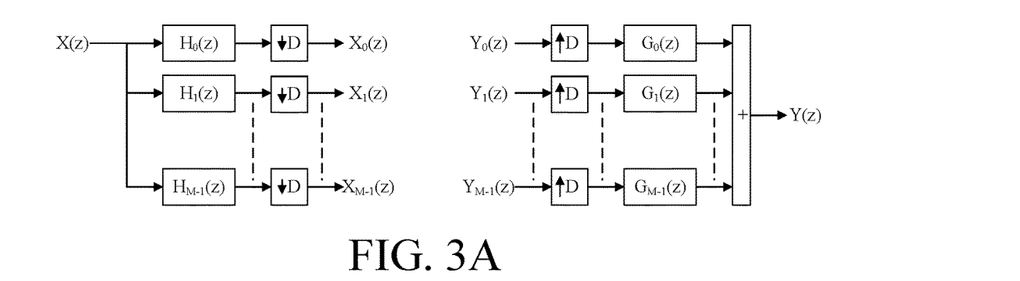
FIG. 3A shows a general illustration of a filter bank.
Figure 3B:
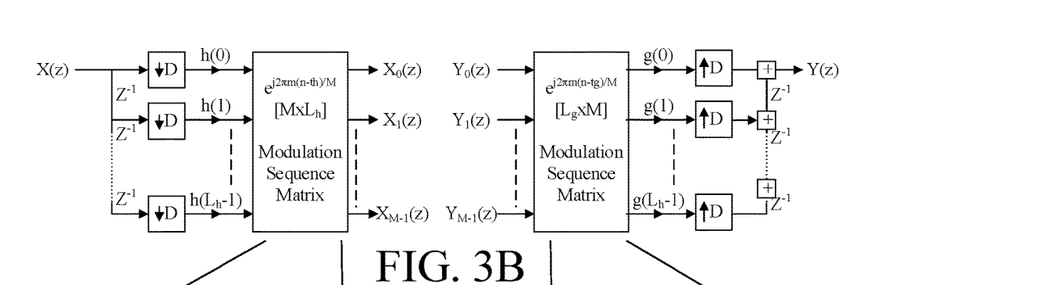
FIG. 3B shows an embodiment of a filter bank according to the present disclosure.
Figure 3C:
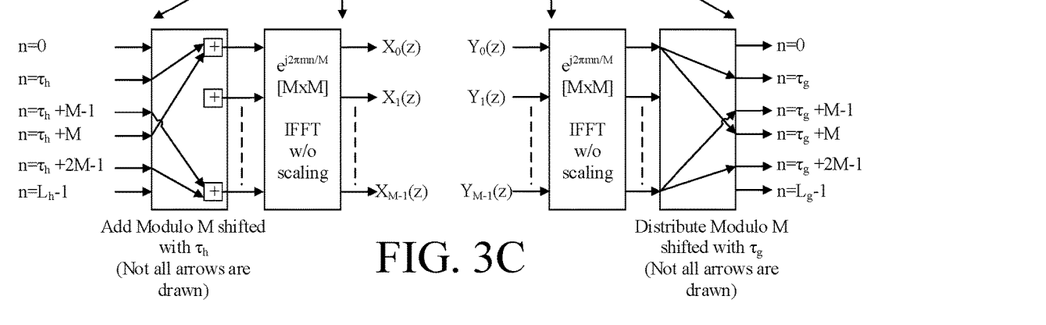
FIG. 3C shows a detailed view of a modulation sequence matrix unit of the embodiment of FIG. 3B, illustrating the mapping and distribution schemes of the analysis and synthesis filter banks, respectively.

With reference to FIGS. 3B and 3C, the analysis filter bank is described as follows. The analysis filter bank splits the time variant (full band) input signal X(z) into M sub-bands. The impulse responses of the analysis filters are described by:

$h_m(n)=h(n)e^{j2\pi(n-\tau_h)m/M}$

As indicated in FIGS. 3B and 3C (cf. blocks [M×$L_h$] Modulation Sequence Matrix in FIG. 3B and [M×M] IFFT w/o scaling in FIG. 3C). In the above expression, h(n) is e.g. a low-pass FIR prototype filter (real-valued), which is constrained to have odd length, where n is a time index, n=0, 1, ..., $L_h-1$, m is a frequency band index, m=0, 1, ..., M−1, where M is the number of sub-bands. The group delay of the prototype filter is $\tau_h=(L_h-1)/2$, which is an integer number. The filter length $L_h$ is not constrained or related to the number of bands.

The modulation sequence $e^{j2\pi(n-\tau_h)m/M}$ shifts the prototype filter in frequency with normalized frequency f=m/M. Since the centre frequency of h(n) is zero, this modulation frequency becomes the centre frequency of the sub-band filter.

The modulation sequence is time-shifted by $\tau_h$. This ensures that, when all bands are summed together, the resulting transfer function is a pure delay, i.e. linear phase and free amplitude distortion.

Time-shifting of the modulation sequence is an important part of the solution to the problem of designing amplitude- and phase distortion free filter banks and also to make it possible to make linear combinations of sub-band signals without phase distortion.

The sum of all analysis filters is:

$$\sum_{m=0}^{M-1} h_m(n) = h(n) \sum_{m}^{M-1} e^{j2\pi(n-\tau_h)m/M} = \delta(n - \tau_h) \quad (1)$$

Since $$\sum_{m=0}^{M-1} e^{j2\pi(n-\tau_h)m/M} = \begin{cases} M, & n = \tau_h + kM, k \in Z, k \neq 0 \\ 0, & \text{otherwise} \end{cases} \quad (2)$$

the following constraint is imposed on h(n). Equation (1) is only valid when h($\tau_h$)=1/M and h($\tau_h$+kM)=0, k∈Z, k≠0. Other values of h(n) are optimized to minimize aliasing distortion. These few constraints imposed on the prototype filter constitute a secondary part of the solution.

Distortion Free DFT-Modulated Synthesis Filter Bank

A similar definition and procedure is used for the synthesis filter bank:

$g_m(n)=g(n)e^{j2\pi(n-\tau_g)m/M}$

Here $\tau_g=(L_g-1)/2$ is the synthesis filter bank delay. The overall filter bank delay is $\tau=\tau_h+\tau_g$. Note again, the time-shifting of the modulation sequence.

Also here, time-shifting of the modulation sequence is the primary part of the solution to the problem of designing amplitude- and phase distortion free filter banks.

The constraint on g(n) is related to the overall filter bank response (excluding aliasing terms):

$$t(n) = \frac{1}{D} \sum_{m=0}^{M-1} h_m(n) * g_m(n)$$

Where * denotes convolution. The overall filter bank response $\tau(n)=\delta(n-\tau)$ is free of amplitude and phase distortion and is pure delay. This holds only when:

$$\frac{1}{D}\sum_{m=0}^{M-1} h_m(n) * g_m(n) = \begin{cases} 1, & n = \tau \\ 0, & n + \tau + kM, k \in Z, k \neq 0 \end{cases} \quad (3)$$

The left hand side of (3) is zero for all other values of n, inherently to the definitions of the analysis and synthesis filters being modulated from their prototype filters respectively.

These few constraints imposed on the prototype filter are the secondary part of the solution.

Iterative Method for Prototype Filter Design

An iterative Constrained Least Squares or Quadratic programming method can be used to design the prototype filters to fulfil the constraints and minimize the aliasing distortion in the output signal.

Since the filter bank is used in hearing aids with time-varying gains in the sub-bands, the notion of perfect reconstruction, which is common in filter banks, is not valid here. Perfect reconstruction (which also involves that the filter bank output signal is aliasing free) only holds for filter applications where the processing is additive in nature, for example in signal coding.

Prototype Filter Design

The overall impulse response of the filterbank is given by $$t(n) = \frac{1}{D}\sum_{m=0}^{M-1} h_m(n) * g_m(n)$$

It can be shown that $t(n)=0$ for $n \neq \tau_h + \tau_g + kM$, $k \in N$ due to the modulation of the analysis and synthesis prototype filters. For any given analysis prototype filter, the synthesis prototype filter can be designed to minimize output signal aliasing with the constraint $t(\tau)=1$ and $t(n)=0$, $n=\tau_h+\tau_g+kM$, $k \in N^+$.

The aliasing term impulse responses are described by $$s_{m,d}(n) = \frac{1}{D} h_m(n) e^{j2\pi nd/D} * g_m(n)$$

Aliasing is minimized by minimizing the quadratic cost function $$\sum_{d=1}^{D-1}\sum_{m=0}^{M-1}\sum_{n=-\infty}^{\infty} |s_{m,d}(n)|^2$$

Hence, the design problem can be formulated for the synthesis prototype filter (given an analysis prototype filter) as $$\begin{cases} \min_{g|h} \sum_{d=1}^{D-1}\sum_{m=0}^{M-1}\sum_{n=-\infty}^{\infty} |s_{m,d}(n)|^2 \\ t(\tau_h + \tau_g) = 1 \\ t(n) = 0, n = \tau_h + \tau_g + kM, k \in N^+ \end{cases}$$

The design problem can be formulated for the analysis prototype filter (given a synthesis prototype filter) as $$\begin{cases} \min_{h|g} \sum_{d=1}^{D-1}\sum_{m=0}^{M-1}\sum_{n=-\infty}^{\infty} |s_{m,d}(n)|^2 \\ t(\tau_h + \tau_g) = 1 \\ t(n) = 0, n = \tau_h + \tau_g + kM, k \in N^+ \\ h(\tau_h) = 1/M \\ h(n) = 0, n = \tau_h + lM, l \in N^+ \end{cases}$$

These optimization methods can be used iteratively to reach a minimum aliasing level.

Efficient Filter Bank Implementation

This section show an example of an implementation of the filter bank according tp the present disclosure.

A down-sampled filter bank using these analysis and synthesis filters is depicted in the FIG. 3A.

This can be implemented efficiently using polyphase implementation (reverse the order of math operations and the down/up-samplers). Using the fact that the analysis/synthesis filters are modulated, the mathematical operations can be implemented as a multiplication with the prototype filter weights and matrix multiplication with complex weights.

FIG. 3A shows a general illustration of a filter bank comprising an analysis filter bank (left part of FIG. 3A) and a synthesis filter bank (right part of FIG. 3A). The analysis filter bank comprises M filters $H_m(z)$ ($h_m(n)$ in the time domain, n), m=0, 1, ..., M−1, which converts a time variant input signal X(z) comprising an audio signal into M time variant frequency band signals, each of which are down-sampled with a down-sampling rate D to provide M time variant frequency band signals $X_m(z)$, m-0, 1, ..., M−1, each representing a sub-band of the total frequency range of the input signal X(z). The synthesis filter hank comprises M up-sampling units for up-sampling time variant frequency band signals $Y_m(z)$, m=0, 1, ..., M−1,m and M filters $G_m(z)$ (or $g_m(n)$ in the time domain) for converting the M up-sampled time variant frequency band signals to M filtered signals and a (delay-and-)sum unit (+) for providing a resulting time variant output signal Y(z) representing the audio signal or a processed version thereof (e.g. having been subject to spatial filtering and/or level and/or frequency dependent shaping, e.g. to compensate for a hearing impairment of a user).

FIG. 3B shows an embodiment of a filter bank according to the present disclosure. In the analysis filter bank, the signals from the $L_h$ prototype filters h(n) are matrix-multiplied with the modulation sequence $e^{j2\pi m(n-\tau h)/M}$ in the unit Modulation Sequence Matrix. The matrix multiplications can in turn be implemented efficiently using a mapping procedure and the Fast Fourier Transform (in fact, in both analysis and synthesis filter banks an unsealed IFFT is used) as illustrated in (the left part of) FIG. 3C. In the synthesis filter bank, the M input signals $Y_m$ are matrix multiplied with the modulation sequence $e^{j2\tau m(n-\tau g)/M}$ in the unit Modulation Sequence Matrix providing $L_g$ signals to the $L_g$ prototype filters g(n). The matrix multiplications can in turn be implemented efficiently using an unsealed inverse Fast Fourier Transform and a subsequent distribution procedure as illustrated in (the right part of) FIG. 3C.

FIG. 3C shows a detailed view of a modulation sequence matrix unit of the embodiment of FIG. 3B, illustrating the mapping and distribution schemes of the analysis and synthesis filter banks, respectively.

Figure 4:
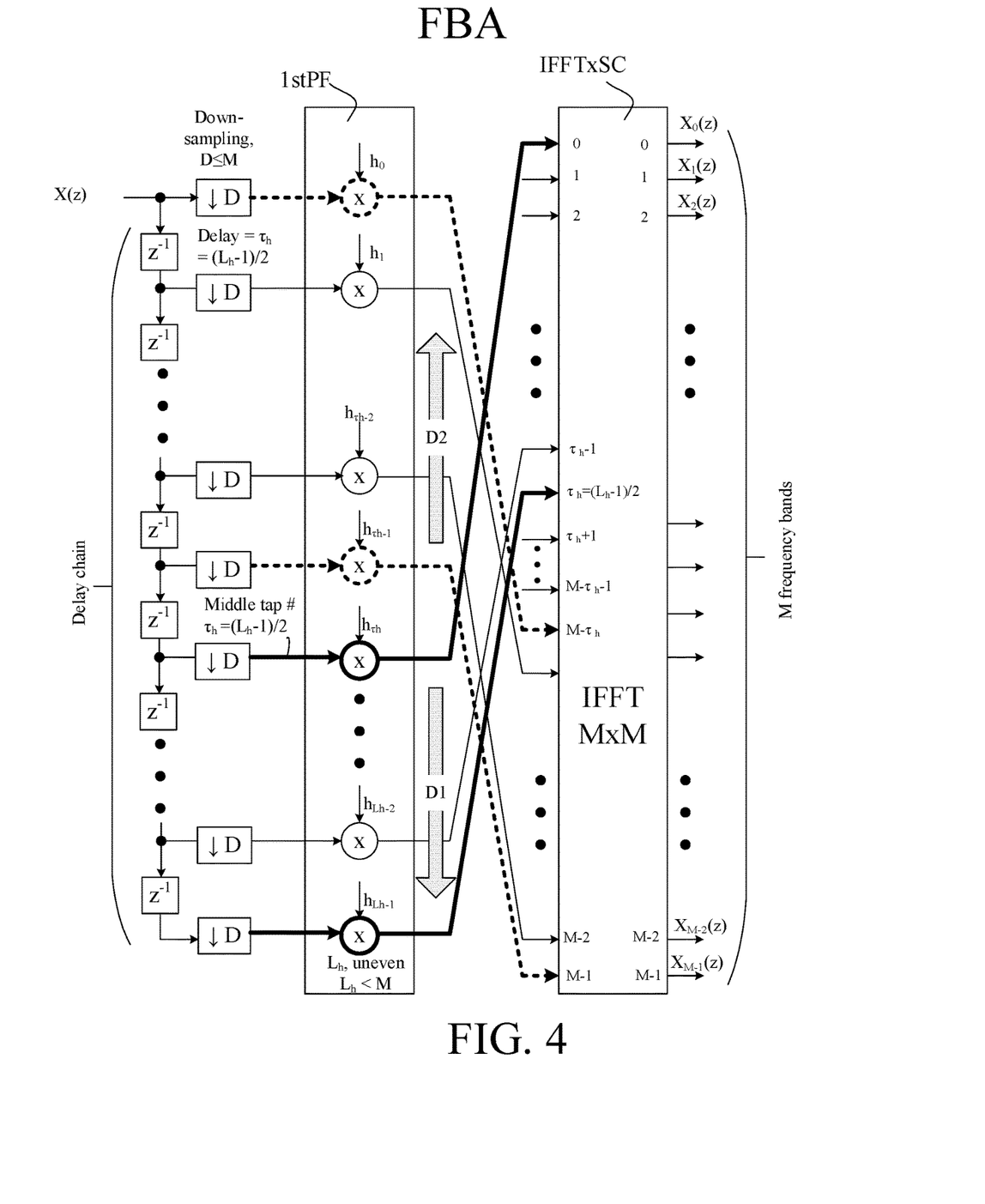
FIG. 4 shows an embodiment of an analysis filter bank according to the present disclosure.

The following expression describes how the $L_h$ inputs are connected to the M outputs of the mapping block at the analysis filter bank side (cf. e.g. MAP block in FIG. 2, the leftmost block in FIG. 3C and FIG. 4). And also how the M inputs are connected to the $L_h$ outputs at the synthesis size (it is just the reverse).

The mapping function symbolized in FIG. 3C by the left-most block denoted Add Modulo M shifted with $\tau_h$ (Not all arrows are drawn) of expression is $$m=\text{MOD}(n-\tau_h,M)$$

where
m=output index,
n=input index,
$\tau_h=(L_h-1)/2$,
M=IFFT size,
and MOD is the modulus operation.
The modulus operation (MOD) may be explained by:

$$\text{MOD}(x,y) \text{ is } x-k^*y \text{ where } k=\text{floor}(x/y) \text{ if } y \neq 0,$$

where FLOOR provides the integer part of x divided by y.

The process of distributing the M IFFT-outputs to Lg outputs of the distribution block in the synthesis filter bank is similarly structured. In fact, the relation is exactly the same for the distribution block in the synthesis filter bank (cf. e.g. DIS in FIG. 2, and the rightmost block in FIG. 3C). In the DIS block an output index n is mapped from m=MOD(n-$\tau_g$, M). Note that here the synthesis filter bank delay $\tau_g$ is a specific parameter that may be different from $\tau_h$.

FIG. 4 shows an embodiment of an analysis filter bank according to the present disclosure. FIG. 4 is intended to exemplify the mapping scheme applied by unit MAP in FIG. 2 and the corresponding unit denoted Add Modulo M shifted with $\tau_h$ in FIG. 3C. FIG. 4 illustrates an analysis filter bank as described in connection with FIGS. 3B and 3C. FIG. 4 illustrates a situation where M is larger than $L_h$ (and $L_g$), whereas FIG. 3C exemplifies a situation where $L_h$ is larger than M.

The mapping in FIG. 4 is divided into two steps D1 and D2 symbolized by grey shaded arrows starting from the outputs of prototype filters h($\tau_h$) (cf. solid line from n=$\tau_h$ to m=0) and h($\tau_h$-1) (cf. dashed line from n=$\tau_h$-1 to m=M-1), respectively.

Step D1: The mapping starts by allocating the output of the prototype filter corresponding to time index n=$\tau_h$ to the top input of the IFFT w/o scaling unit corresponding to band index m=0. Continue by allocating output n=$\tau_h$+1 to m=1, n=$\tau_h$+2 to m=2 until you reach the last output of the prototype filter corresponding to n=$L_h$-1 which is allocated to m=$\tau_h$-1.

Step D2: The mapping starts by allocating the output of the prototype filter corresponding to time index n=$\tau_h$-1 to the bottom input of the IFFT w/o scaling unit corresponding to band index m=M-1. Continue by allocating output n=$\tau_h$-2 to m=M-2, etc. until you reach the first output of the prototype filter corresponding to n=0 which is allocated to m=M-$\tau_h$.

In the case of FIG. 4 where M>$L_h$, the remaining ((M-$\tau_h$)-($\tau_h$)-1=M-$L_h$, middle) inputs of the IFFTxSC unit have no inputs from the prototype filter (h(n) in FIGS. 3B, 3C, 1stPF in FIG. 2). These 'unconnected' inputs are e.g. allocated a logic '0'.

In case $L_h$ is larger than M, the 'extra inputs are cyclically added to already allocated inputs as defined by the above defined mapping scheme and as indicated in FIG. 3C in the unit denoted Add Modulo M shifted with $\tau_h$ as sum unit '+'.

The distribution scheme of the synthesis filter bank is correspondingly performed by allocating outputs corresponding to frequency band indices m=0 to m=M-1 of the IFFT w/o scaling unit to outputs corresponding to time indices n=0 to n=Lg-1 of the Distribute Modulo M shifted with $\tau_g$ unit as shown in the right side of FIG. 3C.

Figure 5:
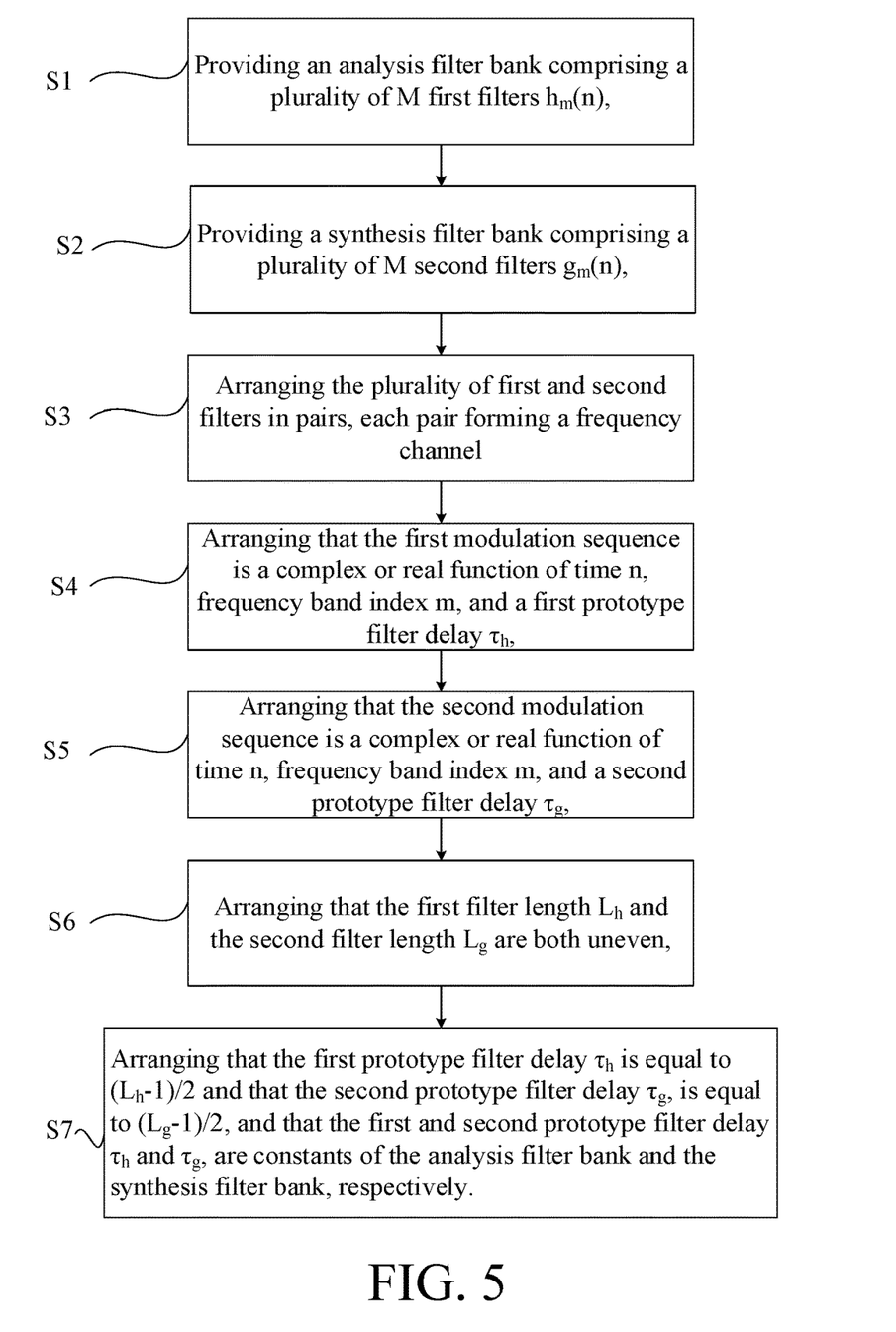
FIG. 5 shows a flow diagram of an embodiment of a method of implementing a filter bank according to the present disclosure.

FIG. 5 shows a flow diagram of an embodiment of a method of implementing a filter bank for an audio processing device according to the present disclosure. The method comprises steps S1-S6 as outlined in the following:

S1. providing an analysis filter bank comprising a plurality of M first filters $h_m$(n), where m=0, 1, . . . , M-1 is a frequency band index, and whose impulse responses are modulated from a first linear phase prototype filter h(n) with a first predetermined modulation sequence ms1, n being a time index, the first prototype filter h(n) having a first filter length of $L_h$;

S2. providing a synthesis filter bank comprising a plurality of M second filters $g_m$(n), m=0, 1, . . . , M-1, whose impulse responses are modulated from a second linear phase prototype filter g(n) with a second predetermined modulation sequence ms2, the second prototype filter g(n) having a second filter length of $L_g$;

S3. arranging the plurality of first and second filters in pairs, each pair forming a frequency channel S4. arranging that the first modulation sequence is a complex or real function of time n, frequency band index m, and a first prototype filter delay $\tau_h$, S5. arranging that the second modulation sequence is a complex or real function of time n, frequency band index m, and a second prototype filter delay $\tau_g$.

S6. arranging that the first filter length $L_h$ and the second filter length $L_g$ are both uneven, and S7. arranging that the first prototype filter delay $\tau_h$ is equal to ($L_h$-1)/2 and that the second prototype filter delay $\tau_g$, is equal to ($L_g$-1)/2, and that the first and second prototype filter delay $\tau_h$ and $\tau_g$, are constants of the analysis filter bank and the synthesis filter bank, respectively.

In an embodiment, the mapping of $L_h$ prototype filter outputs h(n), n=0-$L_h$-1 to M frequency bands m=0 to M-1 (n to m mapping) is given $$m=\text{MOD}(n-\tau_h,M)$$

where m=output index, n=input index, $\tau_h=(L_h-1)/2$, M=IFFT size, and MOD is the modulus operation.

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A filter bank for an audio processing device, e.g. a hearing aid, the filter bank comprising
   an analysis filter bank comprising a plurality of M first filters $h_m(n)$, where m=0, 1, . . . , M−1 is a frequency band index, and whose impulse responses are modulated from a first linear phase prototype filter h(n) with a first predetermined modulation sequence ms1, n being a time index, the first prototype filter h(n) having a first filter length of $L_h$;
   a synthesis filter bank comprising a plurality of M second filters $g_m(n)$, m=0, 1, . . . , M−1, whose impulse responses are modulated from a second linear phase prototype filter g(n) with a second predetermined modulation sequence ms2, the second prototype filter g(n) having a second filter length of $L_g$;
   the plurality of first and second filters being arranged in pairs, each pair forming a frequency channel,
   wherein
   the first modulation sequence is a complex or real function of time n, frequency band index m, and a first prototype filter delay $\tau_h$,
   the second modulation sequence is a complex or real function of time n, frequency band index m, and a second prototype filter delay $\tau_g$,
   the first filter length $L_h$ and the second filter length $L_g$ are both uneven, and
   the first prototype filter delay $\tau_h$ is equal to $(L_h-1)/2$ and second prototype filter delay $\tau_h$, is equal to $(L_g-1)/2$, and the first and second prototype filter delay $\tau_h$ and $\tau_g$, are constants of the analysis filter bank and the synthesis filter bank, respectively.

2. A filter bank according to claim 1 wherein the first modulation sequence ms1 is adapted to shift the first prototype filter h(n) in frequency with a normalized frequency f=m/M, and the second modulation sequence ms2 is adapted to shift the second prototype filter g(n) in frequency with a normalized frequency f=m/M.

3. A filter bank according to claim 1 wherein the first modulation sequence ms1 is adapted to be time shifted by the first prototype filter delay $\tau_h$, and the second modulation sequence ms2 is adapted to be time shifted by the first prototype filter delay $\tau_g$.

4. A filter bank according to claim 1 wherein the center frequency of the first and second prototype filters h(n) and g(n) are both zero.

5. A filter bank according to claim 1 wherein the first modulation sequence ms1 is equal to $e^{j2\pi(n-\tau_h)m/M}$ and the second modulation sequence ms2 is equal to $e^{j2\pi(n-\tau_g)m/M}$.

6. A filter bank according to claim 1 wherein the first prototype filters h(n) are subject to the constraint that the sum of all first filters $h_m(n)$ of the analysis filter bank is equal to $\delta(n-\tau_h)$.

7. A filter bank according to claim 6 wherein the following constraints on the first prototype filter h(n) are imposed:
$h(\tau_h)=1/M$
$h(\tau_h+kM)=0, k\in Z, k\neq 0$.

8. A filter bank according to claim 7 wherein the overall filter bank response t(n), excluding aliasing terms, is subject to the constraint that $t(n)=\delta(n-\tau)$, where $\tau=\tau_h+\tau_g$.

9. A filter bank according to claim 8 wherein the following constraints on the second prototype filter g(n) are imposed:

$$\frac{1}{D}\sum_{m=0}^{M-1} h_m(n) * g_m(n) = \begin{cases} 1, & n = \tau \\ 0, & n + \tau + kM, k \in Z, k \neq 0 \end{cases}.$$

10. An audio processing device comprising a filter bank according to claim 1.

11. An audio processing device according to claim 10 comprising a hearing aid, a headset, an earphone, an ear protection device or a combination thereof.

12. A method of implementing a filter bank for an audio processing device comprising
   providing an analysis filter bank comprising a plurality of M first filters $h_m(n)$, where m=0, 1, . . . , M−1 is a frequency band index, and whose impulse responses are modulated from a first linear phase prototype filter h(n) with a first predetermined modulation sequence ms1, n being a time index, the first prototype filter h(n) having a first filter length of $L_h$;
   providing a synthesis filter bank comprising a plurality of M second filters $g_m(n)$, M=0, 1, . . . , M−1, whose impulse responses are modulated from a second linear phase prototype filter g(n) with a second predetermined modulation sequence ms2, the second prototype filter g(n) having a second filter length of $L_g$;
   arranging the plurality of first and second filters in pairs, each pair forming a frequency channel,
   arranging that the first modulation sequence is a complex or real function of time n, frequency band index m, and a first prototype filter delay $\tau_h$,
   arranging that the second modulation sequence is a complex or real function of time n, frequency band index m, and a second prototype filter delay $\tau_g$,
   arranging that the first filter length $L_h$ and the second filter length $L_g$ are both uneven, and
   arranging that the first prototype filter delay $\tau_h$ is equal to $(L_h-1)/2$ and that the second prototype filter delay $\tau_g$, is equal to $(L_g-1)/2$, and that the first and second prototype filter delay $\tau_h$ and $\tau_g$, are constants of the analysis filter bank and the synthesis filter bank, respectively.

13. A method according to claim 12 wherein the first modulation sequence ms1 is adapted to be time shifted by the first prototype filter delay $\tau_h$, and the second modulation sequence ms2 is adapted to be time shifted by the first prototype filter delay $\tau_g$.

14. Use of a filter bank as claimed in claim 1 in a hearing aid.

15. A data processing system comprising a processor and program code means for causing the processor to perform the steps of the method of claim 12.

* * * * *